(12) United States Patent  
Kok et al.

(10) Patent No.: US 7,773,235 B2
(45) Date of Patent: Aug. 10, 2010

(54) METHOD AND APPARATUS FOR VIBRATION DETECTION AND VIBRATION ANALYSIS, AND LITHOGRAPHIC APPARATUS EQUIPPED WITH SUCH AN APPARATUS

(75) Inventors: Haico Victor Kok, Eindhoven (NL); Koen Kivits, Helmond (NL); Ron Van de Laak, Eindhoven (NL); Johannes Maria Kuiper, Koog aan de Zaan (NL); Gerbrand Van der Zouw, Eindhoven (NL); Hoite P Theodoor Tolsma, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 37 days.

(21) Appl. No.: 12/216,514

(22) Filed: Jul. 7, 2008

(65) Prior Publication Data

US 2009/0051934 A1 Feb. 26, 2009

Related U.S. Application Data

(60) Division of application No. 11/226,468, filed on Sep. 15, 2005, now Pat. No. 7,409,302, which is a continuation-in-part of application No. 10/941,019, filed on Sep. 15, 2004, now Pat. No. 7,308,368.

(51) Int. Cl.
  *G01B 11/14* (2006.01)
(52) U.S. Cl. .................................................. 356/614
(58) Field of Classification Search .......... 356/614–622
  See application file for complete search history.

(56) References Cited

U.S. PATENT DOCUMENTS

| 4,340,304 A | 7/1982 | Massie | 356/489 |
|---|---|---|---|
| 5,285,258 A | 2/1994 | Kamon | 356/401 |
| 5,596,413 A | 1/1997 | Stanton et al. | 356/401 |

(Continued)

FOREIGN PATENT DOCUMENTS

EP 0 969 328 A2 1/2000

(Continued)

OTHER PUBLICATIONS

European Search Report issued for European Patent Application No. 05108492.9-1226, dated Feb. 22, 2007.

(Continued)

*Primary Examiner*—Michael P Stafira
(74) *Attorney, Agent, or Firm*—Pillsbury Winthrop Shaw Pittman LLP

(57) ABSTRACT

The invention provides a method for determining vibration-related information by projecting an aerial image at an image position in a projection plane, mapping an intensity of the aerial image into an image map, the image map arranged for comprising values of coordinates of sampling locations and of the intensity sampled at each sampling location, and measuring intensity of the aerial image received through a slot pattern. The method further includes determining from the image map a detection position of a slope portion of the image map, at the detection position of the slope portion, measuring of a temporal intensity of the aerial image and measuring of relative positions of the slot pattern and the image position, the relative positions of the slot being measured as position-related data of the slot pattern and determining from the temporal intensity of the aerial image vibration-related information for said aerial image.

19 Claims, 15 Drawing Sheets

U.S. PATENT DOCUMENTS

| | | | |
|---|---|---|---|
| 6,278,957 B1 | 8/2001 | Yasuda et al. | 702/150 |
| 6,828,540 B2 | 12/2004 | Landolt | 250/208 |
| 7,068,371 B2 * | 6/2006 | Goo | 356/401 |
| 7,126,689 B2 * | 10/2006 | Nishi | 356/400 |
| 2003/0053035 A1 | 3/2003 | Butler et al. | 355/53 |
| 2003/0128870 A1 | 7/2003 | Pease et al. | 382/144 |
| 2005/0134816 A1 * | 6/2005 | Modderman et al. | 355/53 |

OTHER PUBLICATIONS

Kazuya Ota, et al., "New Alignment Sensors for Wafer Stepper," Proceedings of SPIE Optical/Laser Microlithography, vol. 1463, 1991, pp. 304-314.

* cited by examiner

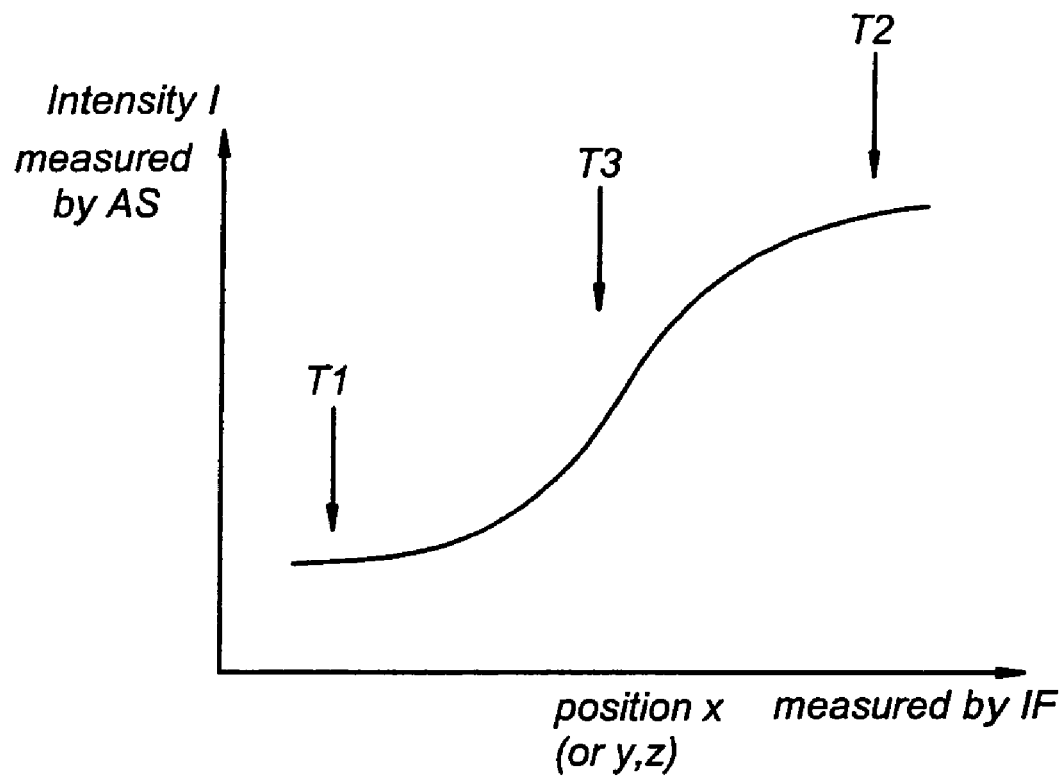

METHOD AND APPARATUS FOR VIBRATION DETECTION AND VIBRATION ANALYSIS, AND LITHOGRAPHIC APPARATUS EQUIPPED WITH SUCH AN APPARATUS

CROSS-REFERENCE TO RELATED APPLICATIONS

This application is a divisional of pending Application Ser. No. 11/226,468, filed Sep. 15, 2005, which claims priority and benefit to a continuation-in-part, U.S. patent application Ser. No. 10/941,019 entitled "METHOD AND APPARATUS FOR VIBRATION DETECTION, METHOD AND APPARATUS FOR VIBRATION ANALYSIS, LITHOGRAPHIC APPARATUS, DEVICE MANUFACTURING METHOD, AND COMPUTER PROGRAM", filed Sep. 15, 2004, now patented as U.S. Pat. No. 7,308,368, issued Dec. 11, 2007, the entire contents of which are hereby incorporated by reference.

BACKGROUND OF THE INVENTION

1. Field of the Invention

The present invention relates to a method and apparatus for vibration detection and vibration analysis, a lithographic apparatus comprising such an apparatus, a device manufacturing method comprising such a method, and a computer program product comprising such a method.

2. Description of Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction), while synchronously scanning the substrate parallel or anti-parallel to this direction.

During exposure of a die, the image of the desired pattern is typically disturbed by a number of sources, for example, vibrations of the projection lens, temperature fluctuations of the ambient along the optical path, vibrations of the framework which encompasses the metrology devices, vibrations of other components and by measurement errors of interferometers for positioning a stage holding the substrate.

Due to the vibration of the image during exposure, a loss of contrast in the image may occur. The loss of contrast will result in reduced accuracy of alignment and of dimensions of (portions of) the imaged pattern. Since the accuracy of alignment is within a few tens of nanometers, the possible occurrence of vibrations with an amplitude of a same order of magnitude may have a strong impact on the image quality. Clearly, vibrations should be minimal.

SUMMARY OF THE INVENTION

The present invention provides systems and methods for determining vibration modes and a measure for their respective magnitude for an assembly, or more in particular, a lithographic apparatus.

According to an aspect of the invention, there are provided methods for determining vibration-related information by:

projecting an aerial image at an image position in a projection plane;

mapping an intensity of the aerial image into an image map, the image map comprising values of coordinates of sampling locations and of the intensity sampled at each sampling location;

measuring intensity of the aerial image received through a slot pattern, determining from the image map a detection position of a slope portion of the image map;

at the detection position of the slope portion, measuring of a temporal intensity of the aerial image and measuring of relative positions of the slot pattern and the image position, the relative positions of the slot pattern being measured as position-related data of the slot pattern; and determining from the temporal intensity of the aerial image vibration-related information for said aerial image.

From the determination of vibration modes, the method derives how to improve transmission image sensing and sensing of alignment between reticle and substrate. This method is applicable both for diagnostics and troubleshooting as well as for purposes of a contrast qualification test.

According to a further aspect of the invention, there is provided an apparatus for vibration-related information determination of an aerial image being projected at an image position in a projection plane, and arranged for mapping an intensity of an aerial image into an image map, the image map comprising values of coordinates of sampling locations and of the intensity sampled at each sampling location;

the apparatus comprising a slot pattern, a photo-sensitive device and a computer system connected to the photo-sensitive device, the photo-sensitive device being arranged in a predetermined position relative to the slot pattern for measuring intensity of the aerial image received through the slot pattern;

the apparatus being arranged for displacing the relative positions of the slot pattern and the image position in the projection plane;

wherein the apparatus for vibration-related information determination is arranged to perform:

determining from the image map a detection position of a slope portion of the image map;

at the detection position of the slope portion, measuring of a temporal intensity of the aerial image and measuring of relative positions of the slot pattern and the image position, the relative positions of the slot pattern being measured as position-related data of the slot pattern; and determining from the temporal intensity of the aerial image vibration-related information for the aerial image.

According to a further aspect of the present invention, there is provided a lithographic apparatus comprising:

an illumination system for providing a projection beam of radiation;

a support structure for supporting patterning devices, the patterning devices serving to impart the projection beam with a pattern in its cross-section;

a substrate table for holding a substrate;

a projection system for projecting the patterned beam onto a target portion of the substrate, and an apparatus for vibration-related information determination of an aerial image being projected at an image position in a projection plane, and arranged for mapping an intensity of an aerial image into an image map, the image map comprising values of coordinates of sampling locations and of the intensity sampled at each sampling location;

the apparatus comprising a slot pattern, a photo-sensitive device and a computer system connected to the photo-sensitive device, the photo-sensitive device being arranged in a predetermined position relative to the slot pattern for measuring intensity of the aerial image received through the slot pattern;

the apparatus being arranged for displacing the relative positions of the slot pattern and the image position in the projection plane;

wherein the apparatus for vibration-related information determination is arranged to perform:

determining from the image map a detection position of a slope portion of the image map;

at the detection position of the slope portion, measuring of a temporal intensity of the aerial image and measuring of relative positions of the slot pattern and the image position, the relative positions of the slot pattern being measured as position-related data of the slot pattern; and determining from the temporal intensity of the aerial image vibration-related information for the aerial image.

According to a still further aspect of the invention, there is provided a device manufacturing method comprising the steps of:

providing a substrate;

providing a projection beam of radiation using an illumination system;

using patterning devices to impart the projection beam with a pattern in its cross-section;

projecting the patterned beam of radiation onto a target portion of the substrate, and determining vibration-related information by:

projecting an aerial image at an image position in a projection plane;

mapping an intensity of the aerial image into an image map, the image map comprising values of coordinates of sampling locations and of the intensity sampled at each sampling location;

measuring intensity of the aerial image received through a slot pattern, wherein the method further comprises:

determining from the image map a detection position of a slope portion of the image map;

at the detection position of the slope portion, measuring of a temporal intensity of the aerial image and measuring of relative positions of the slot pattern and the image position, the relative positions of the slot pattern being measured as position-related data of the slot pattern; and determining from the temporal intensity of the aerial image vibration-related information for the aerial image.

According to yet a further aspect of the invention, there is provided a computer system for use in an apparatus for vibration-related information determination of an aerial image being projected at an image position in a projection plane, and arranged for mapping an intensity of an aerial image into an image map, the image map comprising values of coordinates of sampling locations and of the intensity sampled at each sampling location;

the apparatus comprising a slot pattern, a photo-sensitive device and a computer system connected to the photo-sensitive device, the photo-sensitive device being arranged in a predetermined position relative to the slot pattern for measuring intensity of the aerial image received through the slot pattern;

the apparatus being arranged for displacing the relative positions of the slot pattern and the image position in the projection plane;

wherein the computer system is arranged to enable the apparatus for vibration-related information determination to perform:

determining from the image map a detection position of a slope portion of the image map;

at the detection position of the slope portion, measuring of a temporal intensity of the aerial image and measuring of relative positions of the slot pattern and the image position, the relative positions of the slot pattern being measured as position-related data of the slot pattern; and determining from the temporal intensity of the aerial image vibration-related information for the aerial image.

According to yet a further aspect of the invention, there is provided a computer program product to be loaded by a computer system for use in an apparatus for vibration-related information determination of an aerial image being projected at an image position in a projection plane, and arranged for mapping an intensity of an aerial image into an image map, the image map comprising values of coordinates of sampling locations and of the intensity sampled at each sampling location;

the apparatus comprising a slot pattern, a photo-sensitive device and the computer system connected to the photo-sensitive device, the photo-sensitive device being arranged in a predetermined position relative to the slot pattern for measuring intensity of the aerial image received through the slot pattern;

the apparatus being arranged for displacing the relative positions of the slot pattern and the image position in the projection plane;

wherein the computer program product, after being loaded, allows the computer system to carry out:

determining from the image map a detection position of a slope portion of the image map;

at the detection position of the slope portion, measuring of a temporal intensity of the aerial image and measuring of relative positions of the slot pattern and the image position, the relative positions of the slot pattern being measured as position-related data of the slot pattern; and determining from the temporal intensity of the aerial image vibration-related information for the aerial image.

Moreover, the present invention relates to a use of an apparatus for transmission image detection as described above, wherein the apparatus for transmission image detection is a subsystem of an optical system, the optical system comprising further optical subsystems, and the use includes deriving a subsystem contribution of the vibration-related information for the aerial image for a modulation transfer function of the optical system, the modulation transfer function comprising further contributions for the further optical subsystems of the optical system.

Furthermore, the present invention relates to a use of an apparatus for transmission image detection as described above, wherein the optical system is a lithographic apparatus.

The present invention also relates to a use of an apparatus for transmission image detection as described above, as a preventive maintenance tool, either by monitoring by the computer system or by a remote system over a supervising network.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning devices" used herein should be broadly interpreted as referring to devices that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure supports, i.e. bares the weight of, the patterning devices. It holds the patterning devices in a way depending on the orientation of the patterning devices, the design of the lithographic apparatus, and other conditions, such as for example whether or not the patterning devices are held in a vacuum environment. The support can be implemented using mechanical clamping, vacuum, or other clamping techniques, for example electrostatic clamping under vacuum conditions. The support structure may be a frame or a table, for example, which may be fixed or movable as required and which may ensure that the patterning devices are at a desired position, for example with respect to the projection system. Any use of the terms "reticle" or "mask" herein may be considered synonymous with the more general term "patterning devices".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 14 schematically depicts a graph showing the intensity of an alignment sensor as a function of the interferometer reading;

DETAILED DESCRIPTION

Figure 1:
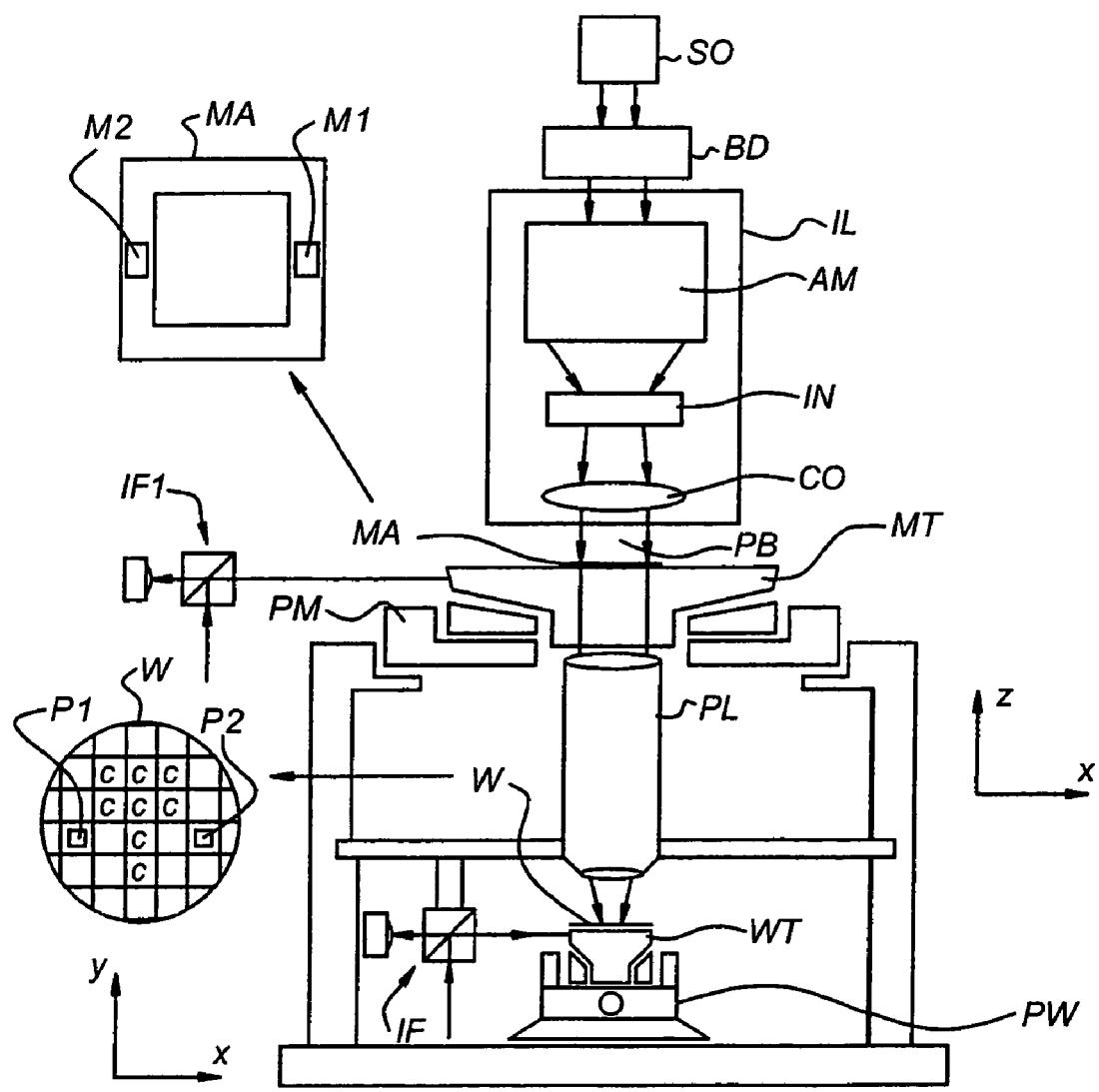
FIG. 1 depicts a lithographic apparatus according to an embodiment of the invention.

FIG. 1 schematically depicts a lithographic apparatus according to an embodiment of the invention. The apparatus comprises:

an illumination system (illuminator) IL for providing a projection beam PB of radiation (e.g. UV radiation).

a first support structure (e.g. a mask table) MT for supporting patterning devices (e.g. a mask) MA and connected to first positioning devices PM for accurately positioning the patterning devices with respect to item PL;

a substrate table (e.g. a wafer table) WT for holding a substrate (e.g. a resist-coated wafer) W and connected to second positioning devices PW for accurately positioning the substrate with respect to item PL; and a projection system (e.g. a refractive projection lens) PL for imaging a pattern imparted to the projection beam PB by patterning devices MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting devices AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioning devices PW and position sensor IF (e.g. an interferometric device), the substrate table WT can be moved accurately, e.g. so as to position different target portions C in the path of the beam PB. Similarly, the first positioning devices PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding programmable patterning devices, and the substrate table WT is moved or scanned while a pattern imparted to the projection beam is projected onto a target portion C. In this mode, generally a pulsed radiation source is employed and the programmable patterning devices are updated as required after each movement of the substrate table WT or in between successive radiation pulses during a scan. This mode of operation can be readily applied to maskless lithography that utilizes programmable patterning devices, such as a programmable mirror array of a type as referred to above.

Combinations and/or variations on the above described modes of use or entirely different modes of use may also be employed.

Figure 2:
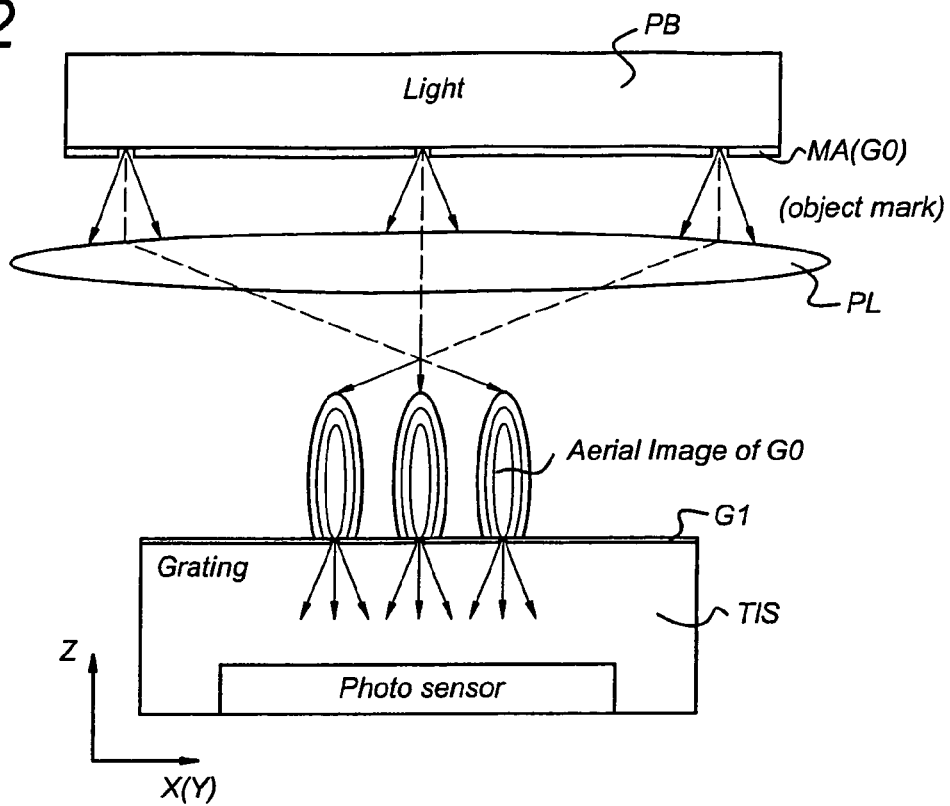
FIG. 2 depicts schematically a device for transmission image detection.

FIG. 2 depicts schematically a device for transmission image detection. Devices for transmission image detection TIS are known from the prior art. The projection Beam PB is incident on a first object G0 for example a grating in the mask MA. The first grating G0 comprises a plurality of openings arranged for creating an image from the projection beam PB. The openings in the first grating G0 each emit a radiation beam RB originating from the projection beam PB.

The radiation beams emitted by the plurality of openings in G0, pass through a lens for example, the projection lens system PL. The optical properties of such projection lens system are such that an aerial image of G0 is formed at a given plane below the projection lens system PL.

The device for transmission image detection TIS is positioned below the projection lens system PL. The device for transmission image detection TIS comprises a slot pattern G1 and a photo sensor device PS.

In its simplest form the slot pattern G1 is simply an opening over the photo sensor device PS which may have the shape of a slit or a square, but which preferably should have a well defined edge. In a more advanced embodiment, the slot pattern G1 may be a second grating. In that case, the second grating G1 is similar in shape to the first grating G0 (the size of G1's features is substantially equal to the size of G0's features multiplied by the magnification factor M of the projection lens system PL). Advantageously, applying a pattern on the opening over the photo sensor device PS increases the number of edges which may improve the sensitivity of the photo sensor PS.

The device for transmission image detection TIS is arranged for transfer relative to the position of the projection lens system PL and the mask MA in three orthogonal directions X, Y, and Z.

By scanning along these three directions the intensity of the aerial image can be mapped as a function of the XYZ position of the device for transmission image detection TIS, for example in an image map (a 3D map), which comprises the coordinates of sampling locations and the intensity sampled at each location. Note that during this procedure the aerial image is projected using a relatively large depth of focus, different from the depth of focus during exposure of the mask image on a substrate.

In practice, the TIS may comprise at least two slot patterns G1, one arranged in the X-direction and the other arranged in the Y-direction for simultaneous image detection in both X and Y directions. In this situation, at least two first gratings G0 are arranged at the MA level, one arranged in the X-direction and the other arranged in the Y-direction for simultaneous image creation in both X and Y directions.

From the 3D map, computational devices connected to the device for transmission image detection TIS can derive the position of the aerial image by for example a parabolic fit of the top position (see FIG. 4) using a least squares fitting method. Such computational devices may be a processor in either dedicated processing devices, a controller system or a (general purpose) computer system, as known to persons skilled in the art.

Figure 11:
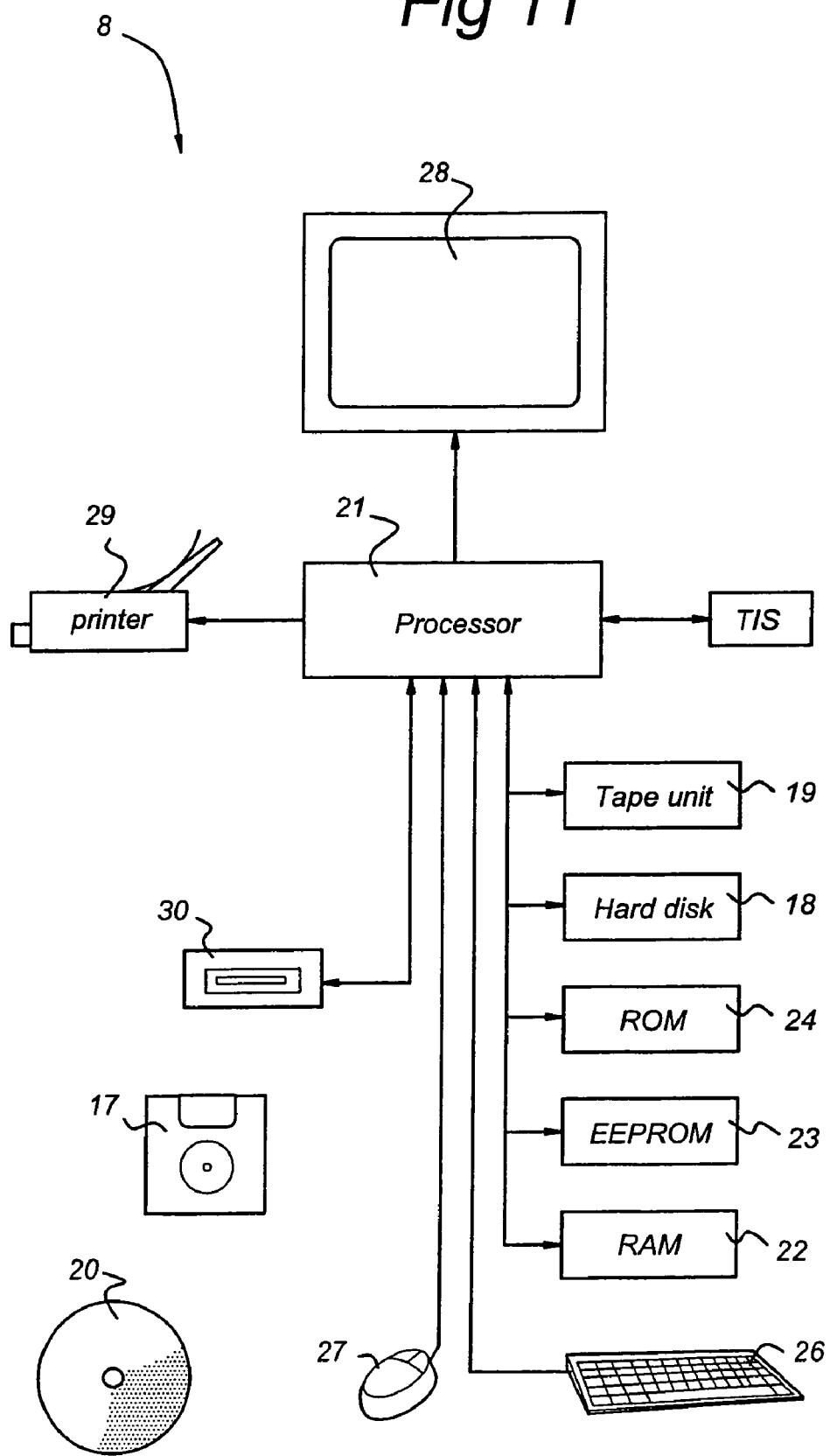
FIG. 11 shows a schematic diagram of computational devices for use in the present invention.

FIG. 11 provides an example of computational devices arranged for determining a position of an aerial image and also for performing the method according to the present invention.

Figure 3:
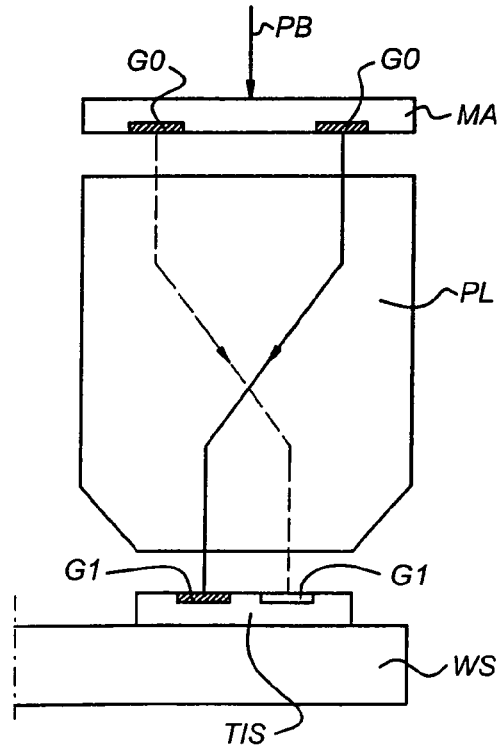
FIG. 3 depicts schematically an alignment step using the device for transmission image detection.

FIG. 3 depicts schematically an alignment step using the device for transmission image detection TIS. During an alignment step using the device for transmission image detection TIS, a mask MA is aligned with respect to the device for transmission image detection TIS which is located at a known position in the wafer stage WS. The optical path OP for each first grating G0 to the corresponding slot pattern G1 is schematically depicted. The alignment procedure takes place while using the same illumination source as for exposure of dies.

Figure 4A:
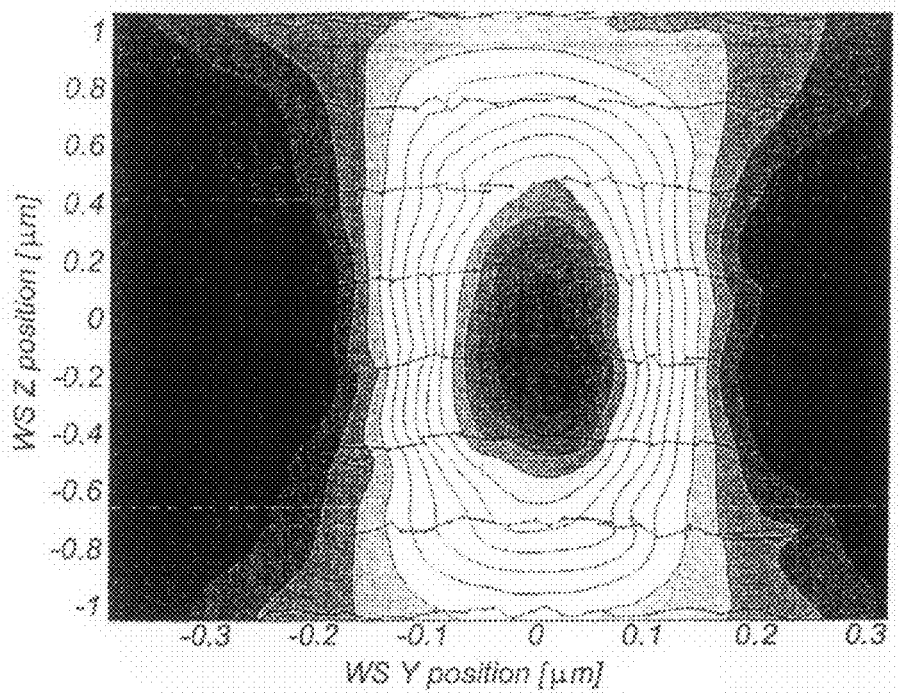
FIGS. 4a and 4b depict exemplary intensity distributions of aerial images detected by the device for transmission image detection in a contour plot and a 3D plot, respectively.
Figure 4B:
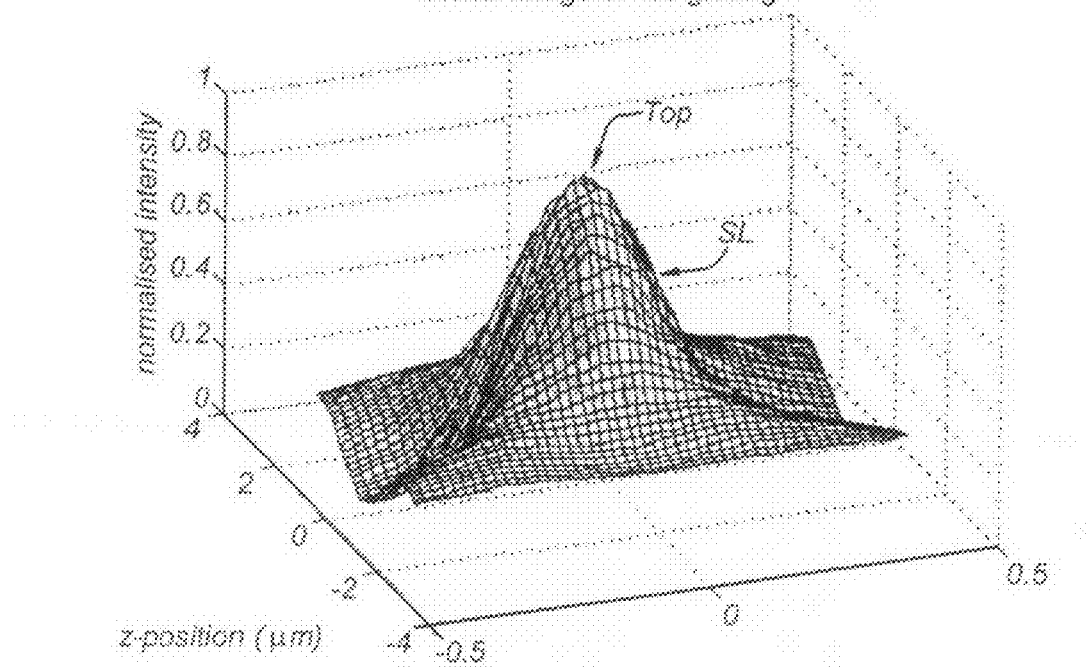

FIGS. 4a and 4b depict exemplary intensity distributions of aerial images detected by the device for transmission image detection TIS in a contour plot and a 3D plot, respectively. The contour plot of FIG. 4a displaying the intensity distribution in the Y-Z plane (i.e., at a fixed X position) is compiled by scanning of the X-Y-surface for a number of different Z positions of the receiving second grating G1. The scan paths are shown as solid lines with dots indicating the measured wafer stage positions. The X, Y, Z positions are wafer stage positions measured by interferometry. As one can see from the scan paths, the measurement positions which were intended to be on an orthogonal grid, appear to be somewhat random. This is due to vibrations in the system.

The 3D plot of FIG. 4b is a modified representation of data representing an intensity distribution in the X-Z plane by plotting the TIS measured intensity as third parameter along the z-axis of the plot.

From the data of FIG. 4a and/or FIG. 4b, the aligned position can be derived by fitting the shape of the measured aerial image to a model. In the prior art, typically the aligned position is derived by a parabolic fit on the top ("Top") of the aerial image peak (as shown in FIG. 4b). As known to persons skilled in the art, alternative methods for fitting data such as a Gaussian fit or a least squares fit may be used as well.

Also, in FIG. 4b a slope SL of the aerial image intensity is schematically indicated. The slope SL will be discussed in more detail below.

Figure 5:
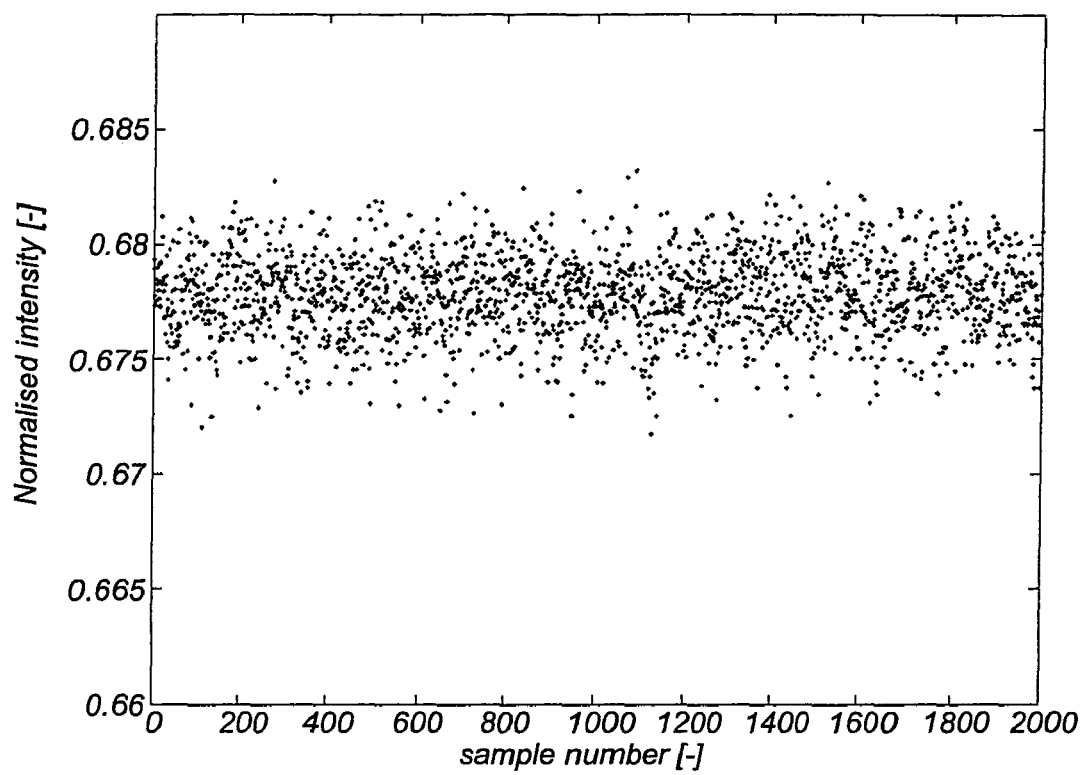
FIG. 5 shows an exemplary measurement of a static scan of the top intensity of an aerial image.

FIG. 5 shows an exemplary measurement of a static scan of the intensity of an aerial image at the top intensity position Top. In FIG. 5, the measured intensity is presented versus sample number.

The graph of FIG. 5 shows the measured intensity variation of a static scan (i.e., sampling without making a scan, although a scan over a very short range may be an option here) on the top of the aerial image. Intensity variations are normally not related to stage variations, due to the large insensitivity of position variations on top of a parabola. The measured intensity variations are usually due to noise contribution of the sensor.

As one can see, the intensity varies randomly by a few percent during this sequence. It will be understood that the variation of the intensity complicates the determination of an aligned position from intensity scans using basically the top of the aerial image. This method from the prior art is rather insensitive for slight position changes. (The top of the fitted parabola is rather flat.)

Figure 6A:
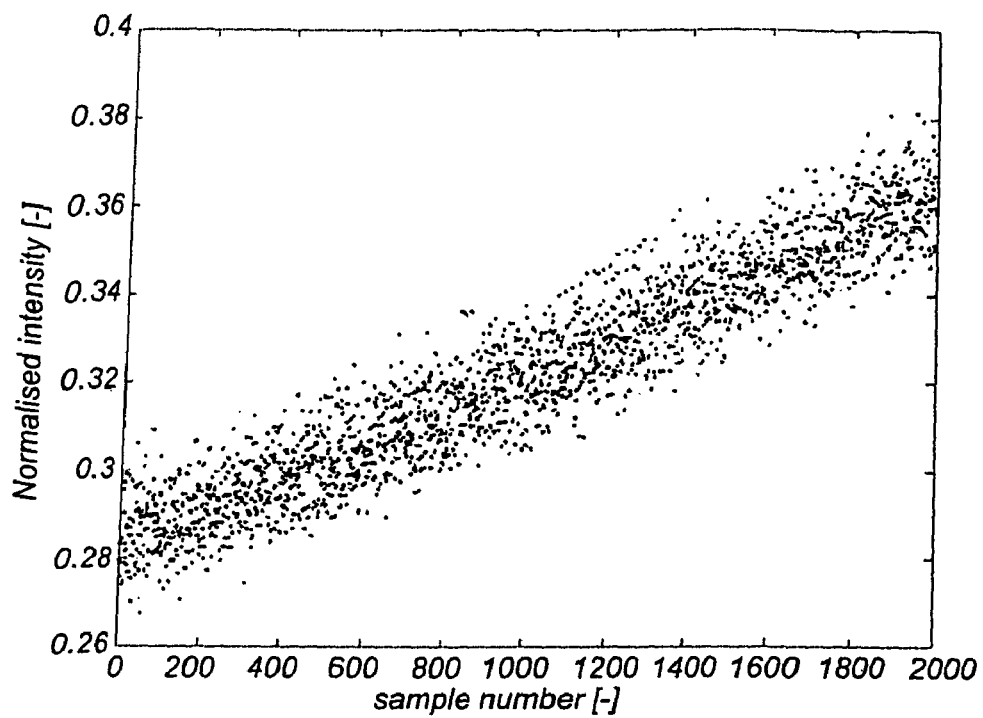
FIGS. 6a and 6b show an example of a measurement of a slope intensity of an aerial image and a simultaneous stage position measured by interferometer in a further sampling sequence, respectively.
Figure 6B:
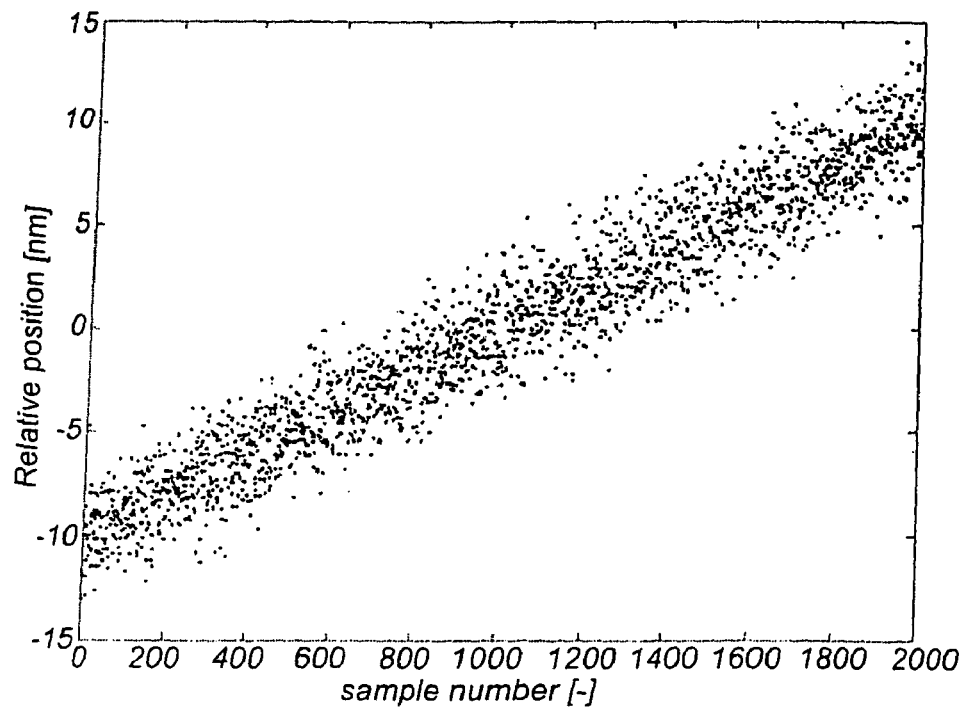

FIGS. 6a and 6b show an example of a measurement of a slope intensity of an aerial image and a simultaneous stage position measured by interferometer in a further sampling sequence, respectively.

The wafer stage position measurement by interferometer (s) is independent from the measurements by TIS. It is however possible to correlate interferometer measurements with aerial image position measurements from TIS.

In an embodiment, the correlation method is carried out as follows:

The shape of the aerial image is determined in a "normal" TIS scan as done in the normal use of TIS, as known from the prior art. From the "normal" TIS scan, the top and slope positions of the aerial image are known. The position of the slope SL can be defined in various ways as known to the person skilled in the art, for example as the position corresponding to the position at substantially half-width of the aerial image peak.

After this first "normal" determination of the shape of the aerial image's intensity, by scanning its top Top and its slope position SL, the device for transmission image detection TIS is arranged for measurements on the slope position SL of the 3D plot of the aerial image.

From the determination of the shape of the aerial image in the first normal determination, the position of the slope SL (at substantially half-width of the aerial image peak) is roughly known (estimated).

The intensity measurement on the slope position SL is then performed with the aerial image being in focus on G1 at the slope SL of the aerial image as presented in FIG. 4b.

In case of a vibration measurement in the focus direction the slope scan is performed at substantially horizontally aligned positions and at the slope position in vertical direction to gain maximum sensitivity in the focus direction. The illumination settings are changed to influence the sensitivity of the measurement on the slope position SL.

Note that the slope coefficient at the slope position SL can be determined in various ways.

In one embodiment, the aerial image remains at a fixed position (slope position SL) relative to the device for transmission image detection TIS without scanning. In this case the determination makes use of the variation of the intensity due to vibrations.

In a further embodiment, the measured position of aerial image varies around the slope position SL by a scanning operation of the device for transmission image detection TIS. In this case the determination makes use of the variation of the intensity due to the shape of the aerial image. Such scans are typically over a short range around the slope position SL, which has typically, a scan length of about 20 nm.

Note that a movement of the image relative to the photo sensor PS in the wafer stage WS will not be equal to a movement of the wafer stage WS. Because of the magnification factor M of the projection lens system PL, movements of the wafer stage WS should be 1/M of that of the reticle stage (i.e., mask table MT).

Next, the device for transmission image detection TIS carries out a number of intensity measurements on the slope SL of the aerial image peak. Due to the relative steepness of the slope, the sensitivity is relatively large: a small change of measurement position (due to vibration or scanning) relates to a relatively large change of the measured intensity.

FIG. 11 shows an example of computational devices arranged for performing steps in accordance with the method of the present invention.

FIG. 6a shows the measured (normalized) intensity of the aerial image at the slope of the image as a function of the sample number (i.e., the number of the respective measurement during the scan). Clearly, the slope of the image is visible in the data, despite a relatively large scatter (of about 5-10%).

During the intensity measurements on the slope SL, simultaneous interferometer measurements for determining the X (and/or Y) position of the wafer stage WS are carried out. These measurements of an interferometer position signal as a function of the sample number during the intensity measurements on the slope are shown in FIG. 6b.

Depending on the implementation of the TIS detector (vibration or scan direction: X, Y or vibration or scan plane XY) and the available interferometers (in X, Y and/or Z direction), vibration measurements can be made in the single X- or Y-direction, the XY-plane or in the Z-direction.

Figure 7:
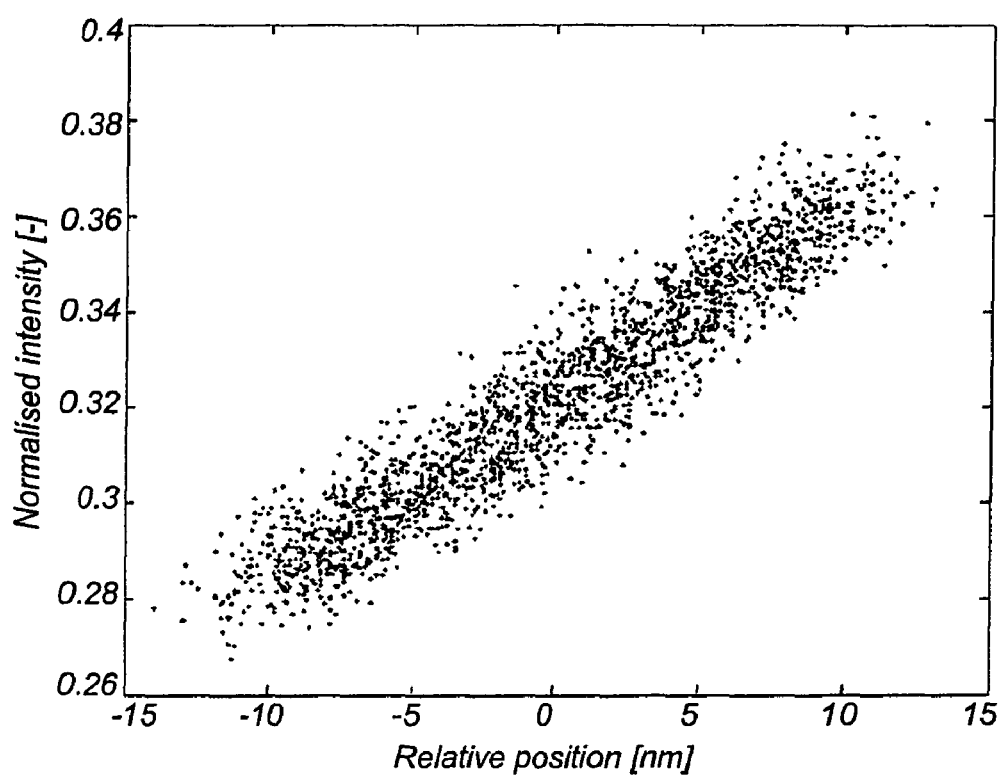
FIG. 7 shows a plot of the slope intensity vs. measured stage position for the measurements of FIGS. 6a and 6b.

FIG. 7 shows a plot of the measured intensity versus stage position of the slope measurements that are presented in FIGS. 6a and 6b.

In FIG. 7 the measured intensity for each sample number is plotted as a function of the interferometer determined wafer stage position for the respective sample number.

The relationship between measured intensity during a plurality of "intensity measurements on the slope" and wafer stage position is clearly shown: on the slope of the aerial image the intensity varies substantially in a linear way with a small change of the wafer stage position. A mean wafer stage position is indicated by '0' on the horizontal axis. By calculation of the correlation (coefficients), the sensitivity relation between wafer stage position and measured intensity of the aerial image of grating G0 can be determined with relatively high accuracy. The sensitivity relation (normally linear behavior) is used to transform the measured intensity data by TIS into position data. In this way two independent position measurements, i.e., one by the TIS detector and one by the interferometer(s), can be compared. Since TIS and the interferometers use different light paths there is a different sensitivity for system vibrations.

The TIS and stage position data are transferred into power spectral densities by means of a Fourier analysis. All system vibrations are applicable to the aerial image, for example as seen during the exposure of a substrate C, whereas the interferometers only measure stage vibrations.

Figure 8:
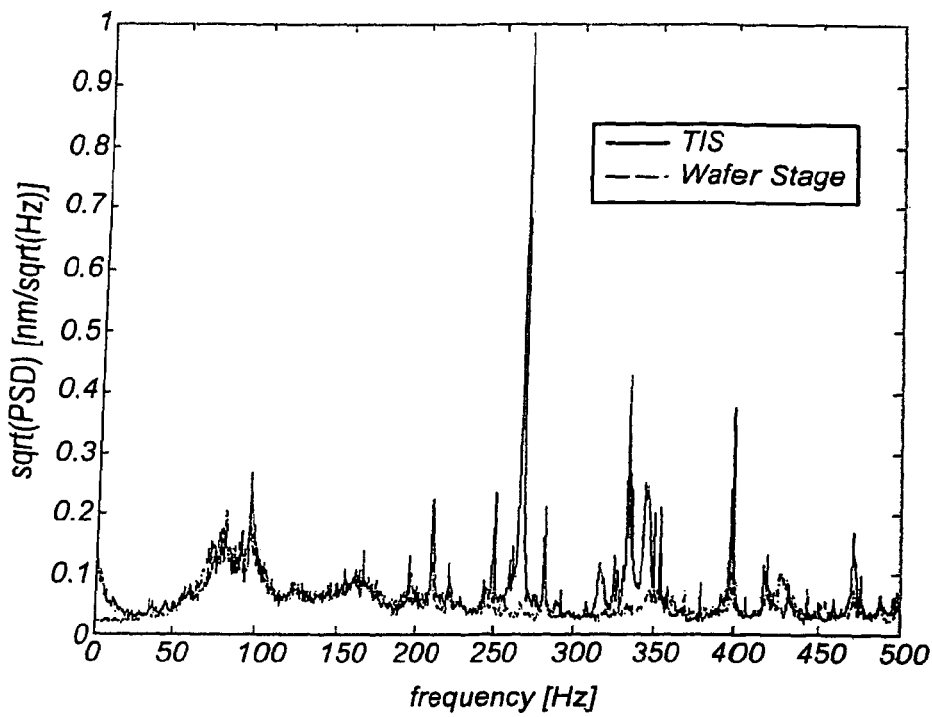
FIG. 8 shows spectral density plots for intensity measurements on the slope of an aerial image and for simultaneous stage position measurements as a function of frequency.

FIG. 8 shows an example of power spectra of the TIS and wafer stage position data as measured by the interferometers. The spectra show only a partial similarity, due to the different sensitivity of the respective measurements on system frequencies. The determination of an aligned position by the transmission image sensor TIS is insensitive to stage vibrations, since stage vibrations are also present in the aerial image and have been taken into account by the least square fit (as discussed with reference to FIG. 4). Vibrations appearing on only one of the sensors can lead to performance reduction. The power spectrum that shows vibrations related to the performance of only the transmission image sensor TIS is obtained from the difference between the power spectra as measured by the TIS and the wafer stage position, respectively, with phase differences taken into account.

Figure 9:
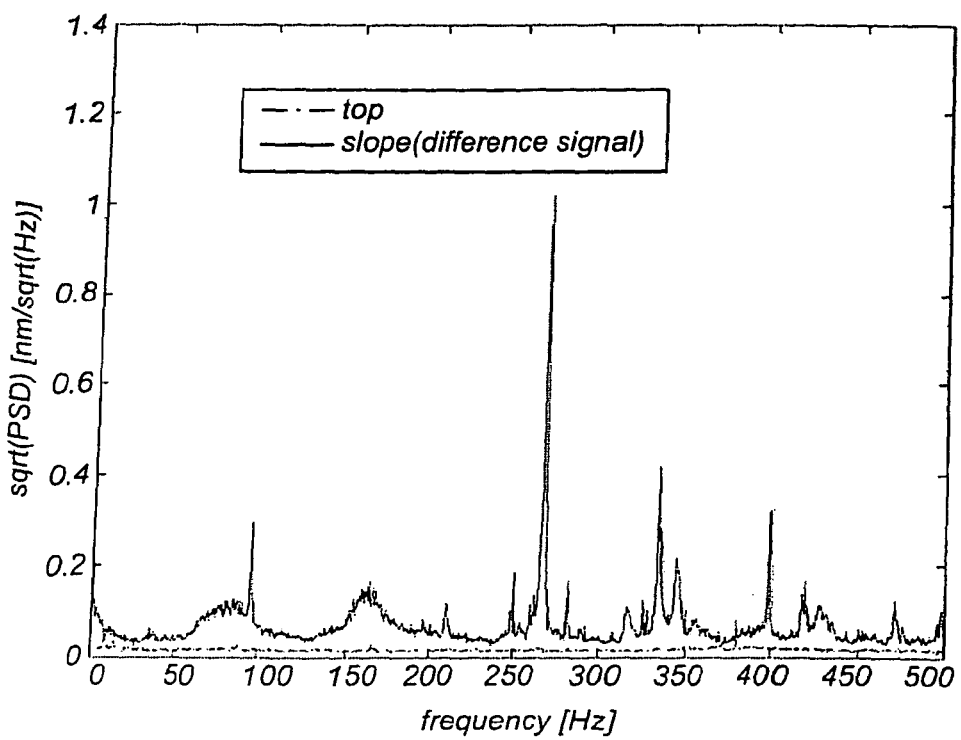
FIG. 9 shows spectral density plots for intensity measurements on top and slope of an aerial image as a function of frequency.

FIG. 9 shows an example of the power spectrum of a top measurement by the TIS and the difference signal of a slope measurement by the TIS.

The power spectra of FIGS. 8 and 9 can be determined for each of the X, Y and Z directions. Since a distinction can be made between light path and measuring direction, system vibrations can be related to both position and frequency. Such system vibrations comprise, for example, short-cuts, wavelength variations, lens vibrations, temperature fluctuations of air, metroframe vibrations (i.e., of frame on which metrology system is mounted) and vibrations of other components, interferometer measurement errors etc.

The intensity measurements on the slope by the device for transmission image detection TIS can be used as a tool for vibration detection in a lithographic apparatus during installation. Additionally, the method can provide a tool for detection of vibration-related process anomalies such as for example, micro-bridging of sub-micron features in semiconductor devices. Also, the tool may be used for preventive maintenance by obtaining data which may be monitored for some maintenance-related characteristics, for example, a change of the relative intensity of some frequency (frequencies) in a vibration frequency spectrum, or a shift of a vibration frequency. The preventive maintenance may be carried out in some automatic mode either by the computation devices of the lithographic apparatus (cf. FIG. 11), or by a remote computation system over some data-link via a supervising network.

System vibrations can be determined in the time domain, besides in the frequency domain as discussed previously, by the slope measurement to analyze intermittent effects. In power spectra, the intermittent effects are averaged and do not yield the maximum disturbance as observed by the system due to the vibrations.

Figure 10:
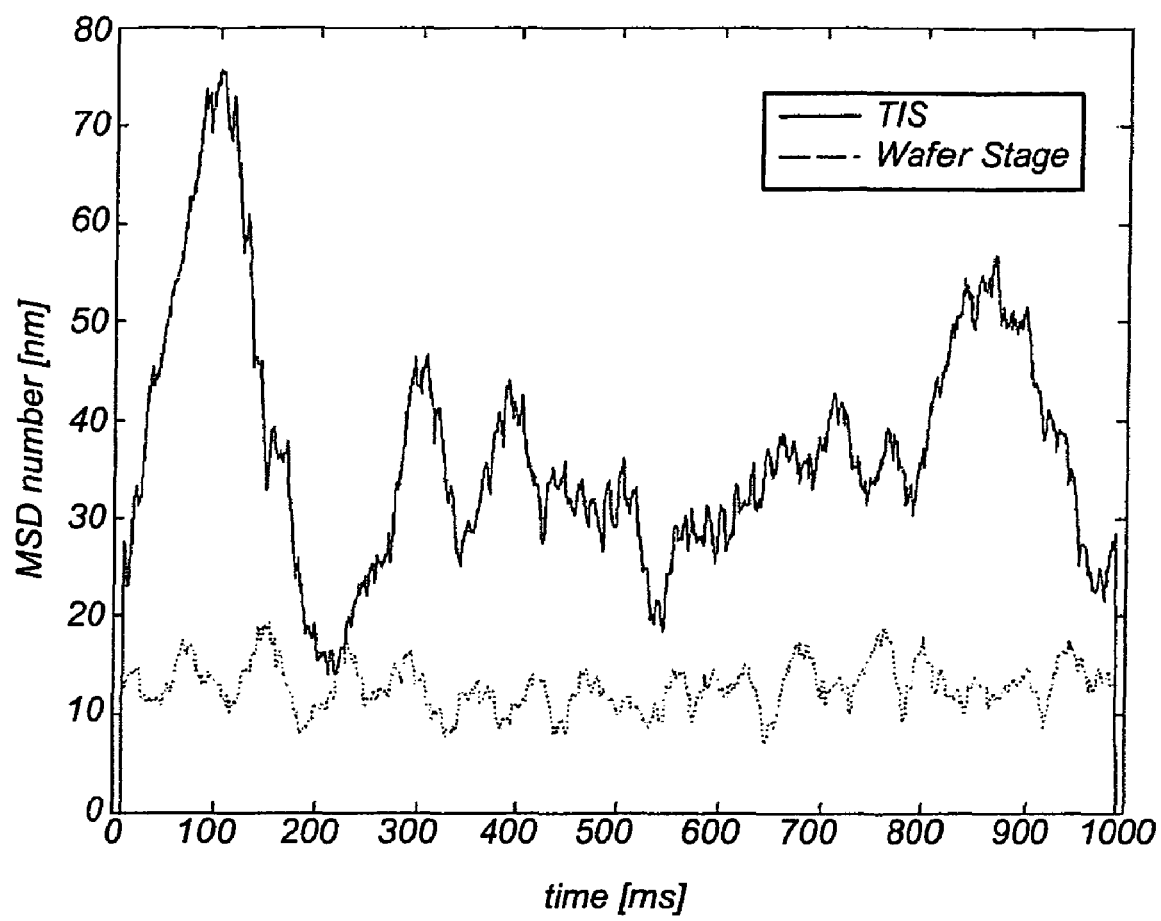
FIG. 10 shows moving standard deviation plots for intensity measurements on the slope of an aerial image and for simultaneous stage position measurements as a function of time.

FIG. 10 shows moving standard deviation (MSD) plots for TIS position and interferometer position signals on the slope of an aerial image as a function of time. In a comparison between TIS position and interferometer position signals (indicated with "wafer stage") clearly a larger contribution of system vibrations is observed in the TIS position signal (aerial image), which vibrations are not constant in time.

The length of a MSD filter (range over which the moving standard deviation is determined) can be taken identical to the specific exposure time of a substrate portion C. The maximum MSD number of the TIS position signal of the slope measurement then gives a qualification of contrast, for example of a lithographic system. Moreover, the maximum TIS MSD number can be used as a qualification specification for contrast of a feature in a pattern (e.g., a dot, line or block) for a lithographic system.

Finally, the method for qualifying the contrast of such a feature in a pattern on a lithographic apparatus according to the present invention can be correlated to a modulation transfer function (MTF) contrast budget of a system such as a lithographic apparatus.

As known by the skilled person, an overall modulation transfer function MTF for an optical system results from a multiplication of the contributions for all subsystems of the lithographic apparatus in the Fourier spatial domain.

The lithographic apparatus comprises a plurality of subsystems, such as the subsystem for positioning wafer stage and/or reticle stages, and other subsystems such as the optical subsystem, the wafer transport subsystem, a reticle exchanger subsystem, the illumination subsystem, etc. each of the subsystems may contribute (in some way) to the generation of vibrations.

The integral MTF is determined by the method according to the present invention.

Optical vibrations reduce the contrast during transfer of information along the optical path: optical vibrations relate to alignment, imaging tolerances, optical quality of components, pupil sizes, and so on. The optical contributions are measurable as known to persons skilled in the art by a wavefront interferometer sensor device, independently from the vibration-related measurements by the device for transmission image detection TIS.

By a first measurement for the optical contributions, the MTF contrast budget can be deconvoluted. It can be compared and correlated with a second measurement for the vibration-related contributions as measured by the method according to the present invention.

Deliberately, noise can be injected into the system via artificial interfaces to study the effects on the proposed analysis methods on its sensitivity and for qualification of the methods. The injected noise can be for example, sinus sweeps, random noise sweeps or pink noise.

FIG. 11 shows schematically a computer system for performing the method according to the present invention.

Computer system 8 comprises host processor 21 with peripherals. The host processor 21 is connected to one or more memory units 18, 19, 22, 23, 24 which store instructions and data, one or more reading units 30 (to read, e.g., floppy disks 17, CD ROM's or DVD's 20, etc.), a keyboard 26 and a mouse 27 as input devices, and as output devices, a monitor 28 and a printer 29. Other input devices, like a trackball, a touch screen or a scanner, as well as other output devices may be provided.

The memory units shown comprise RAM 22, (E)EPROM 23, ROM 24, tape unit 19, and hard disk 18. However, it should be understood that there may be provided more and/or other memory units known to persons skilled in the art. Additionally, one or more of them may be physically located remote from the processor 21, if needed.

The processor 21 is shown as one box, however, it may comprise several processing units functioning in parallel or controlled by one main processor. The processing units may be located remotely from one another, as is known to persons skilled in the art, for example in a network topology.

The computer system 8 is connected to the transmission image detection system TIS. The connection between the computer system 8 and the transmission image detection system TIS may be arranged over a network (not shown). The network may be a local area network, or a wide area network, including telecommunication networks.

The computer system 8 shown in FIG. 11 is arranged to perform the steps of the method of the present invention as described above: i.e., it may control the scanning procedure as well as carry out the data processing on the data collected by the measurements.

The connection of the computer system to the transmission image detection system TIS may be embodied in any way known to persons skilled in the art, e.g., by wire or wireless.

The processor 21 of computer arrangement 8 is capable of executing software code that implements the method for vibration detection and vibration analysis by the device for transmission image detection TIS in accordance with the present invention.

As already mentioned, the above described arrangement may be used as a tool for vibration detection in a lithographic apparatus. In fact, the above described arrangement may be used as an analyzing tool for analyzing the behavior of a lithographic apparatus. This is further explained below.

When using a lithographic apparatus, the reproducibility and the accuracy of the system are important. So, in order to optimize the performance of such a system, the reproducibility and the accuracy need to be diagnosed. However, when performing such diagnostics it is difficult to distinguish between the performances of different parts of the machine, such as the performance of the substrate table WT (undesired movements), the performance of the sensors used to measure the position of alignment marks and the substrate table WT, noise in the electronics used to process the measurement signals, etc.

By simultaneously watching the readings of an alignment system AS, which measures the position of an alignment mark AM on the substrate table WT, and watching the readings of the interferometer IF, which measures the position of the substrate table WT, while the substrate table WT is not actuated, an analysis may be made of the behavior of the system. It will be understood that, when the substrate table WT is not actuated, in principle, the readings of both the alignment system AS and the interferometer IF should match. However, in practice, this is not the case, due to all kinds of undesired vibrations, undesired movements, measurement errors etc. By analyzing the readings of both the alignment system AS and the interferometer IF and using information about the sensitivity of the alignment system AS to movements of the alignment mark AM, the system may be diagnosed, as will be further explained below.

Figure 12:
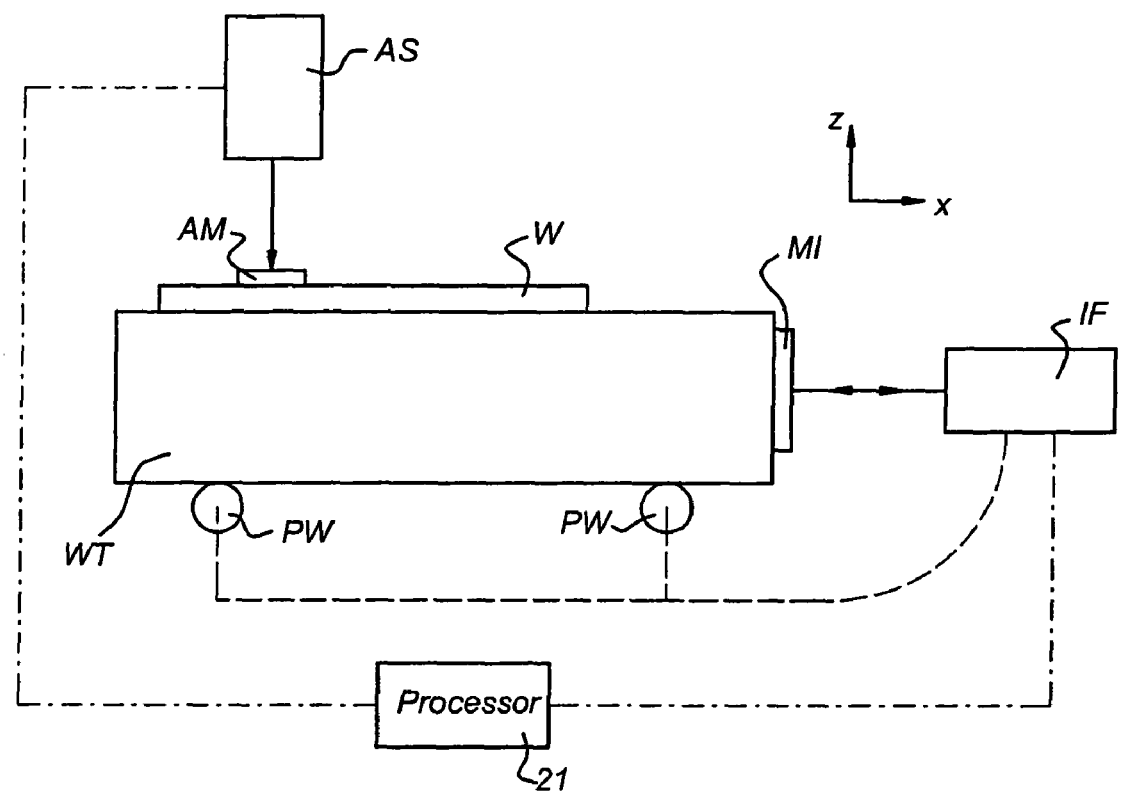
FIG. 12 schematically shows a measurement set-up according to an aspect of the invention.

FIG. 12 schematically depicts an example of such an analyzing tool. FIG. 12 depicts substrate W, positioned on substrate table WT. The substrate W is provided with at least one alignment mark AM. Of course, more than one alignment mark AM may be provided. Alignment marks AM may also be provided on the substrate table WT instead of or in addition to alignment marks AM on the substrate W.

The analyzing tool further comprises an alignment system AS for measuring the position of the at least one alignment mark AM. The alignment system AS may be the transmission image detection TIS as already described in detail above, but may also be an alternative alignment sensor AS, which will be explained in more detail below.

The analyzing tool further comprises at least one interferometer IF. The interferometer IF measures the position of the substrate table WT in the x direction (see coordinate system depicted in FIG. 12). Of course, other interferometers IF may be provided, for instance to measure the position of the substrate table WT in other directions, such as the y direction (being perpendicular with respect to the drawing surface). The substrate table WT is provided with mirrors MI that are used for the measurement with the interferometer IF, as will be understood by a skilled person. The interferometers IF may be used to measure the position of the substrate table WT in the x, y and Rz direction (Rz being a rotational position about the z axis).

The position information x, y, RZ as measured by the interferometer IF may be used in a position control system to keep the substrate table WT in a desired position. This may be done by using a feedback loop, which constantly monitors the position of the substrate table WT and provides a control signal to positioning devices PW connected to the substrate table WT to adjust the position of the substrate table WT when a difference is detected between the measured position and the desired position.

FIG. 12 further shows a processor 21 that is arranged to communicate with alignment system AS and interferometer IF. The processor 21 is arranged to control the alignment system AS and the interferometer IF performs the measurements as described above. The processor 21 may further be arranged to receive measurement results from the alignment system AS and the interferometer IF, store these measurements and present these measurements. The processor 21 may be formed as part of computer system as shown in FIG. 11.

Of course, the feedback loop of the interferometer IF as described above, may also be executed by the processor 21.

As already stated, the tool as described here may be used in combination with all types of alignment systems AS, such as the transmission image detection TIS described above, or any other known or yet to be developed off-axis alignment sensor. Also other alignment systems may be used, for instance alignment systems that use an alignment beam that travels through the lenses of the projection system PS. These alignment sensors are usually referred to as through-the-lens alignment sensors (TTL).

Figure 13:
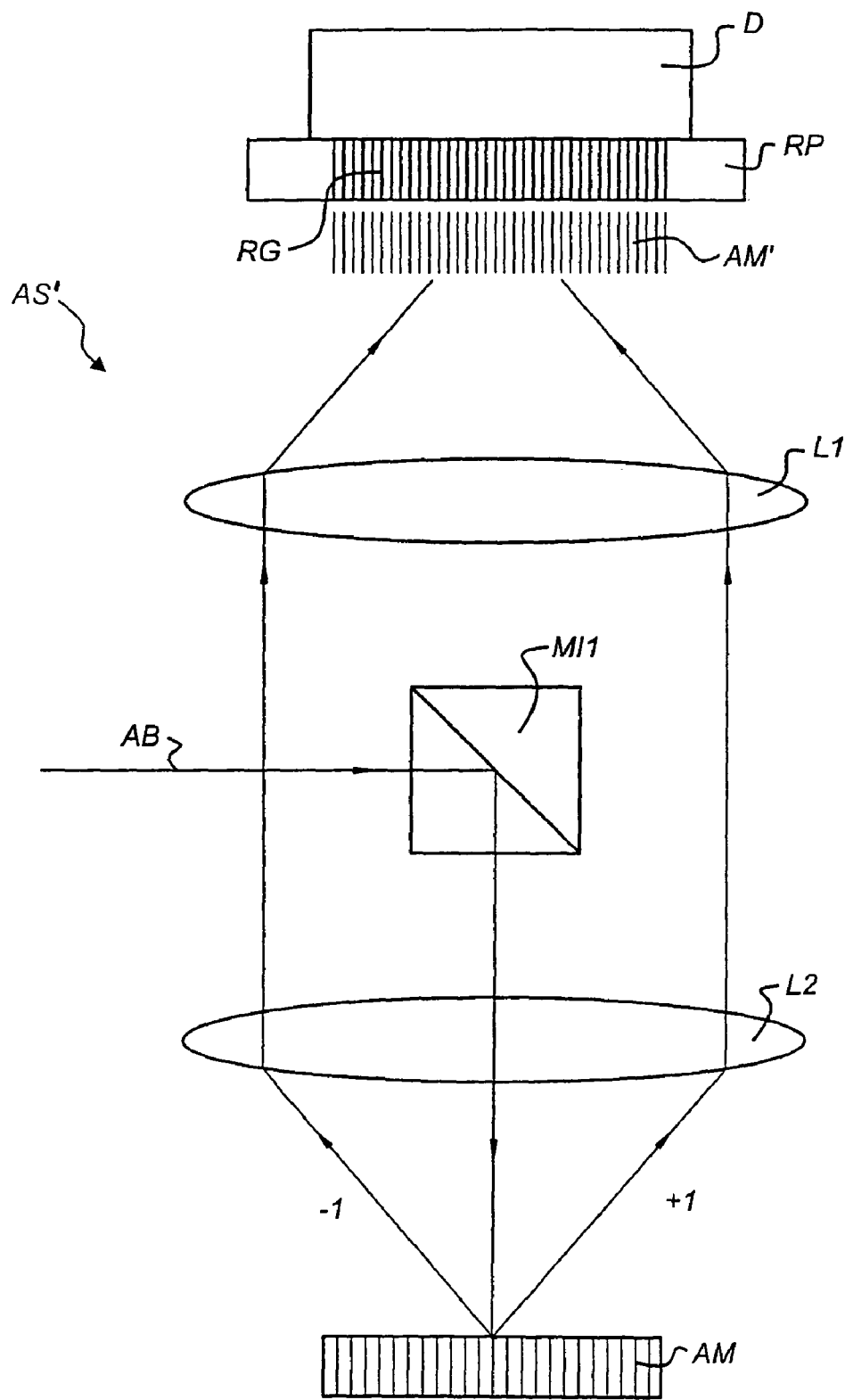
FIG. 13 schematically shows an alternative measurement alignment sensor according to an alternative embodiment.

An example of an alternative alignment system AS' is explained here with reference to FIG. 13.

FIG. 13 depicts an alternative, off-axis alignment sensor AS' that is arranged to measure a position of an alignment mark AM. Such an off-axis alignment sensor AS' can, e.g., be used at a measurement location differing from an exposure location, as is known, e.g., from dual stage lithographic systems. During alignment, a radiation beam illuminates the alignment mark AM via a mirror MI1 and a lens L2. The alignment mark AM diffracts the alignment beam AB of radiation into several diffraction orders such as +1, −1, +2 and −2. By using optical elements L1, L2, each set of corresponding diffraction orders (say +1 and −1) respectively form an image of the alignment mark AM' onto a reference plate RP. The reference plate RP comprises reference gratings RG for each set of corresponding diffraction orders to be measured. Behind each reference grating RG a separate intensity detector D is arranged to measure the intensity of the radiation in the image passing through the reference gratings RG provided on the reference plate RP. By moving the alignment mark AM' relative to the reference plate RP (or the other way around), the position with the highest intensity for one or more images is found, which gives the aligned position.

In order to enhance performance, the intensity of several images can be measured and the alignment beam AB radiation can consist of multiple colors.

It will be understood that the alignment system AS described above, also referred to as the transmission image detection TIS (see FIG. 3), may only be used at a limited number of positions on the substrate table WT, while the alternative alignment system AS', described with reference to FIG. 13, may be used at positions on the substrate table WT, but may also be used at a desired number of positions on the substrate W itself.

The tool as described here may be used in combination with all types of alignment sensors AS, AS' that detect a variation of measured intensity I with changing position of the alignment mark AM.

Such a theoretical dependency is schematically shown in FIG. 14. FIG. 14 depicts an intensity I as measured by alignment systems AS, AS' being a function of the position of the alignment mark AM (and thus the substrate table WT) in the x direction. Of course, similar dependencies exist in the y direction. The curve depicted in FIG. 14 may be part of a sinus curve, in which three typical measurement positions can be distinguished:

T1: being a position in which the intensity I is low, having a slope of substantially zero, T2: being a position in which the intensity I is high, having a slope of substantially zero, and T3: being a position in which the intensity I is in between the intensities of T1 and T2, having a slope being different from zero.

First an alignment scan may be performed to determine the positions of T1, T2 and T3. This may be done by measuring intensity I with the alignment system AS, AS' while scanning the alignment system AS, AS' over the alignment mark AM, i.e. moving the substrate table WT in a certain direction, for instance the x direction. This scanning may for instance be done with a scan speed of 1.5 or 3.0 nm/s.

Simultaneously, the x position of the substrate table WT is measured using the interferometer IF. Combining the data measured by the alignment system AS, AS' and the interferometer IF gives the curve as depicted in FIG. 14, although in this case with noise contributions.

Next, alignment measurements are performed, having a scan speed of 0 mm/s, i.e. a plurality of alignment measurements are performed using the alignment system AS, AS', while simultaneously measuring the position of the substrate table WT (and thus the alignment mark AM) using the interferometers IF. Since the scan speed is zero and thus, the alignment mark AM is not moving, theoretically, the alignment system AS, AS' and the interferometer IF should give constant readings. However, their readings are not constant as a result of different kinds of noise. By performing these zero-speed alignment measurements at position T1, T2 and T3 respectively, and comparing the outcome of these measurements, information can be obtained about different kinds of noise.

Figure 15A:
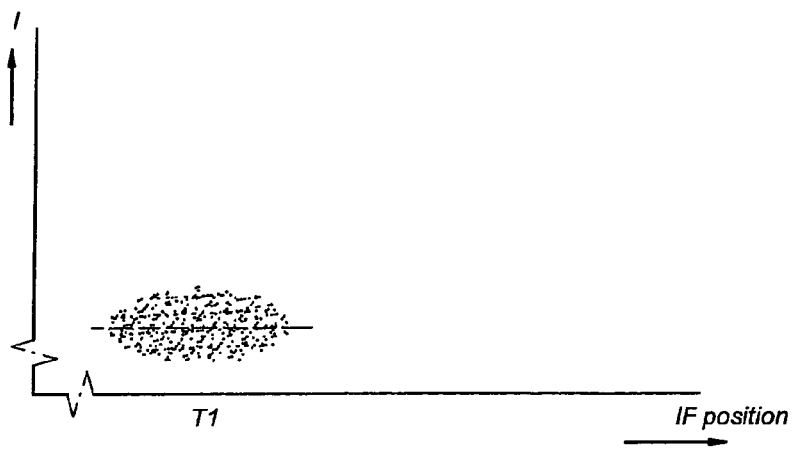
FIGS. 15a, 15b and 15c each depict scatter plots of measurements performed at different positions according to the invention.
Figure 15B:
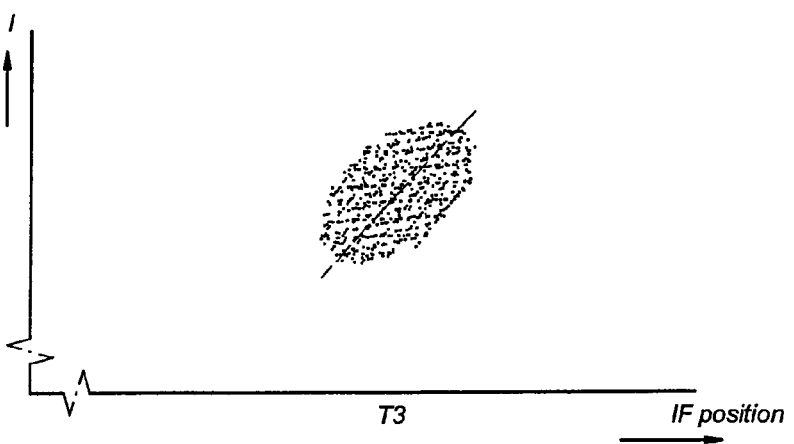
Figure 15C:
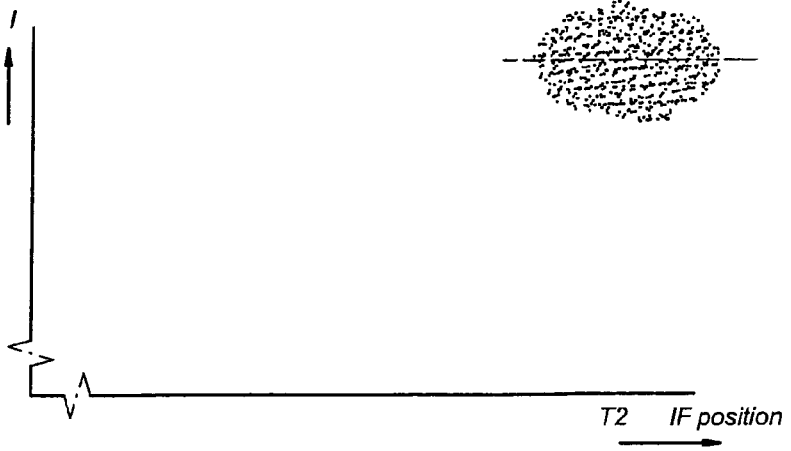

In order to do this, measurements are performed at positions T1, T2 and T3 by sampling the readings of the alignment sensor AS, AS', and the interferometer IF at a rate of for instance 20,000-40,000 samples per second. The results of these samples may be plotted in a scatter plot, such as shown in FIGS. 15a, 15b and 15c. The scatter plots of FIGS. 15a, 15b, and 15c, respectively, are obtained by plotting each of the plurality of alignment measurements taken at positions T1, T2 and T3 respectively in a graph, where the axis IF depicts the position as measured by the interferometer IF and the axis I position depicts the intensity I as measured by the alignment system AS, AS'.

The width of the scatter plot in the direction of the axis IF position represents a measure for measurement errors of the interferometer IF (e.g. caused by air flows in between the interferometer IF and the MI) and undesired movements of the substrate table WT. The width of the scatter plots in the direction of the axis I may be a measure for noise produced by the electronics of the alignment sensor AS, AS', light noise (laser noise), interferometer noise, frame deformations etc., depending on the position T1, T2 or T3, as will be further explained below.

FIG. 15a schematically depicts a scatter plot of an alignment measurement performed at position T1, i.e. at the bottom of the intensity curve of the alignment system AS, AS' as depicted in FIG. 14. At this position, the intensity I of the light measured by the alignment system AS, AS' is relatively low, so the contribution of, e.g., the light noise (laser noise) to the vertical width of the scatter plot is relatively low.

Fluctuations in the intensity of the alignment beam AB as generated result in noise at the measurements of the alignment system AS, AS'. This is called light noise or laser noise.

Also, the contribution of unwanted movements of the substrate table WT to the measurements of the alignment system AS, AS' is relatively low, since the intensity curve of the alignment system AS, AS' as depicted in FIG. 14 is flat at T1 (slope is zero). Thus, unwanted movements, such as vibrations of the substrate table WT do have little effect on the readings of the alignment sensor AS, AS'.

So, at position T1, the width of the scatter plot in the direction of the axis I is mainly caused by noise produced by the electronics of the alignment sensor AS, AS'.

At position T2, as shown in FIG. 15c, again the contribution of unwanted movements of the substrate table WT to the scatter plot is relatively low, since the intensity curve of the alignment system AS, AS' as depicted in FIG. 14 is flat at T2 (slope is zero). However, the light noise (laser noise), mainly caused by fluctuations in the light intensity I of the alignment beam AB, is present at T2, in contrast to position T1, as discussed above. So, the width of the scatter plot in the direction of the axis I at T2 is caused by noise produced by the electronics of the alignment sensor AS, AS' (similar to T1) and light noise (laser noise).

Finally, at position T3, as shown in FIG. 15b, the width of the scatter plot in the direction of the axis I at T2 is not only caused by noise produced by the electronics of the alignment sensor AS, AS' and light noise (laser noise), but also by unwanted movements, such as vibrations of the substrate table WT. Fluctuations of the position of the substrate table WT result in a fluctuation of the measurement by the alignment sensor AS, AS', as position T3 is on the slope of the intensity curve of the alignment system AS, AS' as depicted in FIG. 14. Fluctuations of the position of the substrate table WT may be caused by vibrations and frame deformations. Fluctuations of the position of the substrate table WT may also be caused by measurement errors of the interferometer IF. An error in the reading of the interferometer IF results in a change of the position of the substrate table WT, as the interferometer IF corrects for the (erroneous) reading via the feedback loop.

As described above, the lithographic apparatus may be used in different modes, one of them being the so-called step mode, in which the mask table MT and the substrate table WT are kept essentially stationary, while an entire pattern imparted to the projection beam is projected onto a target portion C in one go. The substrate table WT is then shifted in the x and/or y direction so that a different target portion C can be exposed.

The tool as described above may be used to analyze the behavior of the substrate table WT and the interferometer IF once the substrate table WT has come to a stop after such a step movement. It will be understood that the movement of the substrate table WT may cause all kinds of effects that disturb the stability of the system, and may for instance influence the readings of the interferometers.

Figure 16:
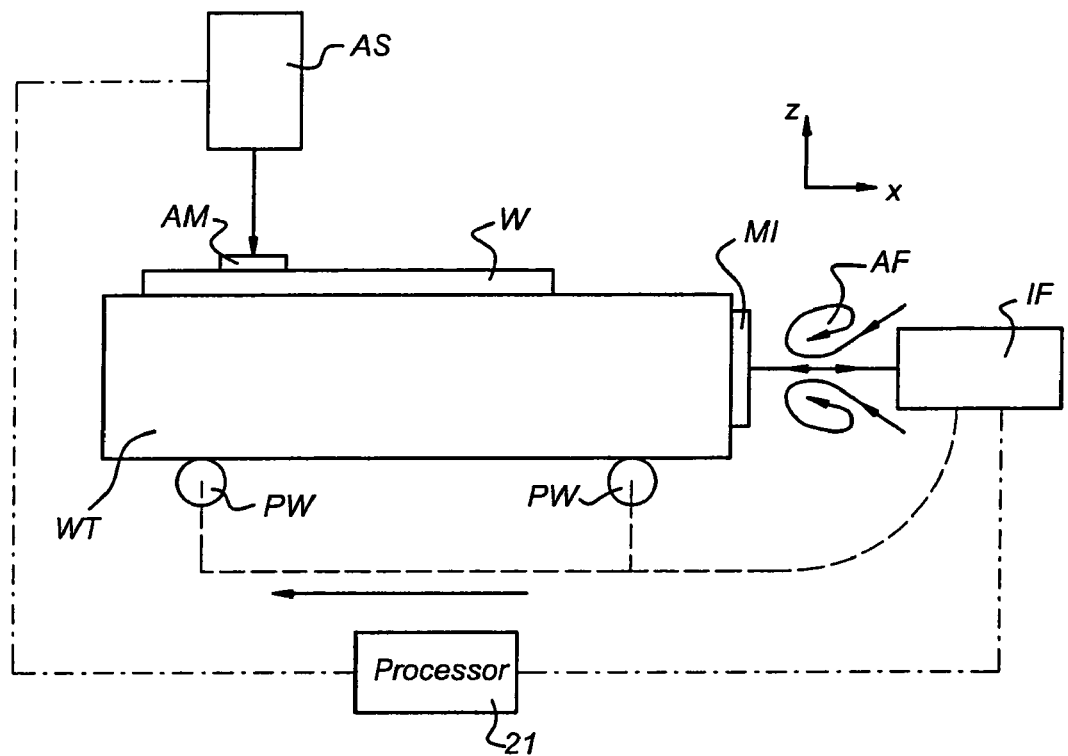
FIG. 16 schematically shows a measurement set-up according to an alternative embodiment of the invention.

FIG. 16 schematically depicts an example of possible influence on the interferometer IF, caused by the movement of the substrate table WT. The same references refer to similar objects as in the previous figures.

In FIG. 16, the substrate table WT has just moved to the left and has come to a stop at the position as depicted. As a result, the air or gas present in between the mirror MI and the interferometer IF is disturbed and turbulent or laminar air flows AF may occur.

The interferometer IF determines the distance between the interferometer IF and the mirror MI provided on the substrate table WT. In order to do this, the interferometer IF generates a radiation beam RB and splits the radiation beam in a first portion and a second portion. The first portion is outputted to the mirror MI at the substrate table WT, where it is reflected back to the interferometer IF. By superpositioning the second portion of the radiation beam RB and the reflected first portion of the radiation beam RB information can be obtained about the relative position of the substrate table WT and the interferometer IF.

The superposition of the reflected first portion and the second portion of the radiation beam RB is sensitive to changes in the optical path length between the interferometer IF and the mirror MI (and thus the substrate table WT), which changes can be used to measure the distance between the interferometer IF and the mirror MI. It will be understood that the optical path length does not only depend on the distance between the interferometer IF and the mirror MI, but also on the refractive index n of the air or gas present in between the interferometer IF and the mirror MI. Small changes of temperature, humidity etc. influence the refractive index n and thus the measurement of the interferometer IF.

The air flows AF now may cause such changes, as they 'refresh' the air or gas in between the interferometer IF and the mirror MI. The 'fresh' air or gas may have a different temperature and/or humidity, and thus influences the readings of the interferometer IF.

As explained above, the interferometer IF corrects for deviations in the readings via the feedback loop and the positioning devices PW. This causes the substrate table WT to be moved as indicated in FIG. 17, while the interferometer readings IF are relatively stable.

Figure 17:
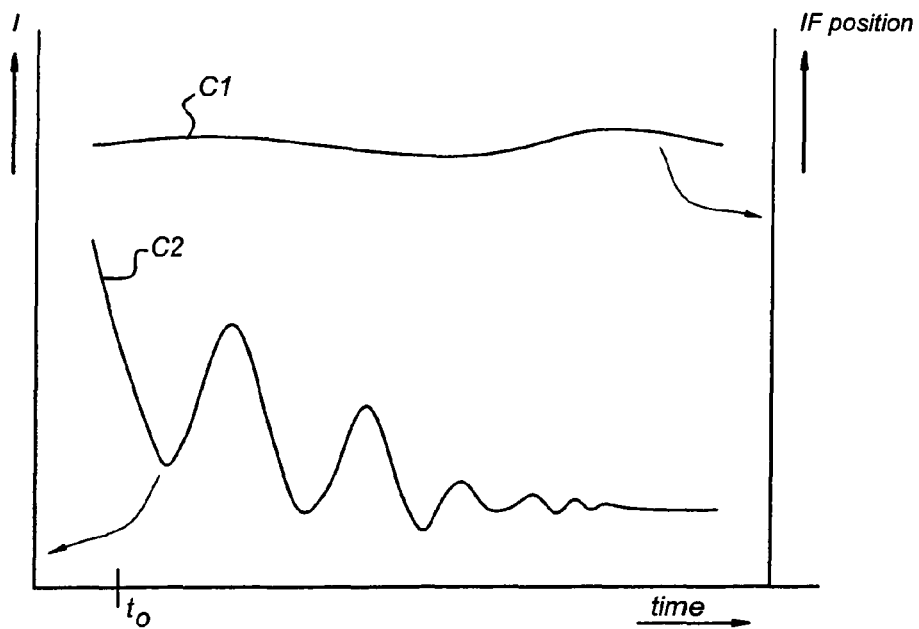
FIG. 17 schematically depicts a graph of the intensity as measured by the alignment system and the interferometer readings as a function of time, and FIG. 18 schematically depicts Fourier transforms of the readings of the alignment sensor and the interferometer.

FIG. 17 depicts a first graph C1 and a second graph C2, respectively, representing a measurement result of the alignment system AS, AS' at T3 and a measurement result of the interferometer IF, respectively, both as a function of time after the substrate table WT has stopped at time to. It will be understood from FIGS. 15a, 15b and 15c that position fluctuations with smallest deviations of the substrate table WT can best be measured at position T3, where the intensity I as measured by the alignment system AS, AS' is most sensitive to variations of the position of the substrate table WT.

Graph C2 shows that the position of the substrate table WT is moving and that it takes time before the substrate table WT has came to a standstill. At the same time, C2 representing the readings of the interferometer IF is relatively stable, as a result of the feedback loop.

Based on this analysis, the influence of air flows AF on the interferometer IF and thus, measurement errors of the interferometer IF as a result of these air flows AF may be estimated. Measuring the intensity I as measured by the alignment system AS, AS' at position T3 for a predetermined period of time gives a good measure how long it takes after a step before the whole system is stable again. Experiments may be done with varying step size, varying step speed, measuring at different positions at the substrate table WT, different air flows AF to determine this period.

According to a further alternative embodiment, the system may be assessed by generating Fourier transforms to the frequency domain of the intensities I as measured in time by the alignment system AS, AS' and the position as measured in time by the interferometer IF. This analysis may provide information about resonance frequencies of the components of the lithographic projection apparatus, such as the substrate table WT, (parts of) the projection system PL, the mask table MT or the illumination system IL.

Figure 18:
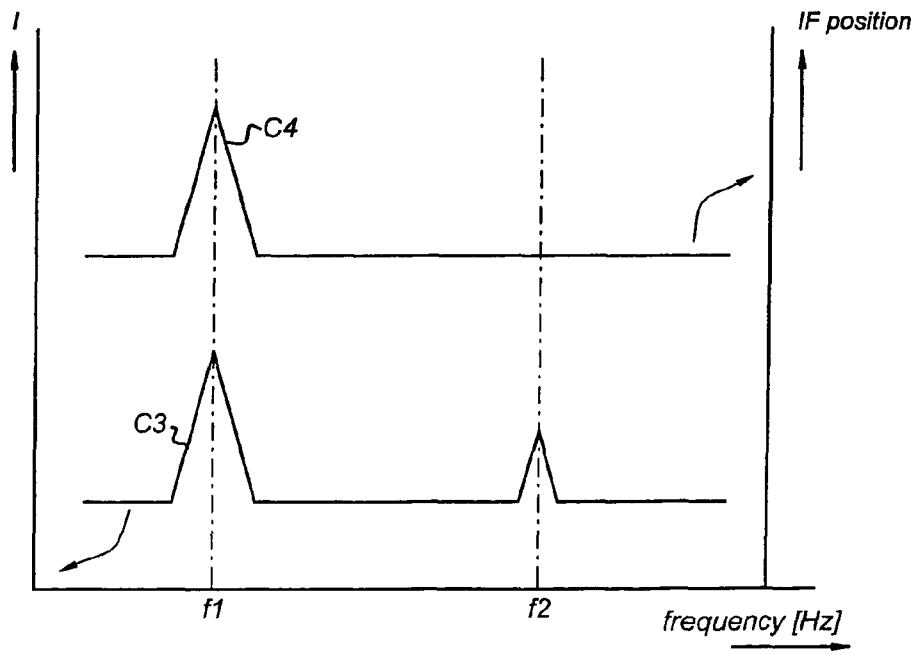

FIG. 18 depicts a graph C3, showing a first distribution of intensities obtained by a Fourier transforms of the intensities I as measured by the alignment system AS, AS' as a function of the frequency (see left vertical axis), and a graph C4 showing a second distribution of intensities I obtained by a Fourier transform of the intensities I of the position as measured by the interferometer IF as a function of the frequency (see right vertical axis). Again, in this example, the alignment system AS, AS' is at position T3, in order to have a maximum sensitivity of the alignment system AS, AS' to the position of the substrate table WT (alignment mark AM).

As can be seen in FIG. 18, the graphs C3, C4 do not show the same frequency distributions. C3, showing the Fourier transform of the intensities I as measured by the alignment system AS, AS' shows two frequency peaks at $f_1$ and $f_2$, while C4 showing the Fourier transform of the intensities of the interferometer IF has only one frequency peak at $f_1$. It will be understood that a common frequency component, like the one shown at frequency $f_1$, in both Fourier transforms is due to e.g. vibrations of the substrate table WT, as these will show in the readings of both the alignment sensor AS, AS' and the interferometer IF.

Non-correlated frequency peaks have other causes. For instance, the peak at $f_2$, as depicted in FIG. 18, is only visible in the readings of the alignment sensor AS, AS', and not in the readings of the interferometer IF. This peak may be caused by noise in the electronics of the alignment system AS, AS'. Frequency peaks that only show up in the readings of the interferometer IF will relate to causes that only influence the interferometer IF measurement, like errors of the interferometer IF that are corrected for via the feedback loop or light noise (laser noise) of the interferometer. Another error that may influence only one of the readings may be a vibrating lens in the projection system PS when only one of the sensors directs its measurement beam through the projection system PS.

According to an embodiment, different data sets can be selected in time. For instance, measurement data relating to frequencies present during the first 50 ms after the substrate table WT has come to a stop after a step made by the substrate table WT may be separated from measurement data relating to frequencies after 2 seconds of stabilization.

So, in general, the performance of the lithographic apparatus may be analyzed, by performing alignment scans with a scan speed of 0 mm/s at predetermined positions. The positions may be selected from a first position T1, having minimum light intensity I, a second position T2, having maximum light intensity I and a third position T3, having a maximum sensitivity with respect to the position of the alignment mark AM and the substrate table WT. By performing measurements with two sensors that perform different measurements, both sensors providing information about the same parameter (like the position of substrate table WT/alignment mark AM or any other object) where each sensor has a different noise behavior, information could be obtained about the system.

During the alignment scans with a scan speed of 0 mm/s, measurement data are gathered of the alignment system AS, AS', and the interferometers IF (in the x, y and Rz position), with a sampling rate of for instance 10,000-20,000 samples per second, depending on the system configuration.

The substrate table WT is under interferometer control via a feedback loop (servo feedback loop). As a result, the actual readings of the interferometer IF should substantially be constant and, the intensities measured by the alignment system AS, AS', should also be constant. However, this is not the case, due to different kinds of causes. By analyzing the variations of the measurement signals, the system may be analyzed. By comparing the measurement results of the different measurement devices causes may be analyzed and distinguished. The comparison is mainly looking for differences between the results of the two measurements.

In the examples of the embodiments described above, it has been assumed that one of the sensors is an interferometer and the other sensor is, e.g., a transmission image sensor or a through-the-lens sensor. However, other measurements setups are intended to fall within the scope of the appended claims, like setups in which a first sensor is a transmission image sensor and another sensor is an off-axis alignment sensor like the one shown in FIG. 13. In general terms, in embodiments, any one of the position sensors used may be one of a device for transmission image detection, an off-axis alignment sensor, a through-the-lens alignment sensor and an interferometer.

The above method may for instance be used in a lithographic apparatus when overlay and/or alignment reproducibility is more than is to be expected. The tool as described here may be performed relatively fast (within 5 minutes) and does not require additional materials or equipment. The outcome of the tests may be used to determine which subsystem (e.g. interferometer IF, substrate table WT, (parts of) projection system PL, mask table MT or illumination system IL) of the lithographic apparatus may need further observation.

The above method may be used in all kinds of lithograph apparatus, including all sorts of single stage machines, as well as all sorts of multi stage machines, such as dual stage machines, in which the additional tables may be used in parallel, or preparatory steps may be carried out on one or more tables while one or more other tables are being used for exposure. The tool as described here may be used to determine crosstalk between the different stages, such as expose-to-measure crosstalk.

In an expose-to-measure crosstalk assessment, the influence of the movements of a first substrate table WT, e.g. being exposed, to a second substrate table WT may be investigated. This may be done by performing a measurement scan with a scan speed of 0 mm/s on the second substrate table WT, as described above, while the substrate W positioned on the first substrate table WT is exposed. Such a measurement is preferably done at position T3. By performing such a test, the influence of air flows AF, generated by the movement of the first substrate table WT on the interferometers IF of the second substrate table WT may be analyzed.

All the methods described above may be at least partially performed by the processor 21. Thus, the invention also relates to a computer program product comprising data and instruction that can be loaded by the processor 21 allowing the processor 21 to perform these methods. Moreover, the invention also relates to a data carrier comprising such a computer program product.

While specific embodiments of the invention have been described above, it will be appreciated that the invention may be practiced otherwise than as described. The description is not intended to limit the invention. The scope of the invention is defined by the appended claims.

We claim:

1. A method of measuring a position of an object, comprising:

performing a first position measurement by a first sensor while the object is stationary and a second position measurement by a second sensor while the object is stationary, the first and second position measurement differing in type from one another, one of the first and second sensors being configured and arranged to measure a position of an alignment mark positioned either on the object or on a substrate positioned on the object and the other of the first and second sensors being configured and arranged to measure the position of the object at a position other than the position of the alignment mark, both the first position measurement and the second position measurement comprising taking a plurality of samples in time, and presenting the first measurement and the second measurement.

2. The method of measuring according to claim 1, wherein said method comprises performing said first and second position measurement simultaneously.

3. The method according to claim 1, wherein the method further comprises comparing the measurements of the first and second sensor.

4. The method according to claim 1, wherein the first sensor is one of a device selected from the group consisting of: a transmission image detection, an off-axis alignment sensor, a through-the-lens alignment sensor and an interferometer, and wherein the device of the second sensor is different in type than a device used as the first sensor.

5. The method according to claim 1, wherein the second sensor is one of a device selected from the group consisting of: a transmission image detection, an off-axis alignment sensor, a through-the-lens alignment sensor and an interferometer, and wherein the device of the second sensor is different in type than a device used as the first sensor.

6. The method according to claim 1, wherein the method comprises:

generating an alignment beam;

directing the alignment beam to an alignment mark positioned on the object;

receiving a reflected beam from the alignment mark by the first sensor;

measuring the reflected beam from the alignment mark with the first sensor, the measured intensity varying with the position of the object.

7. The method according to claim 6, wherein the intensity as measured by the first sensor varies with the position of the object and comprises:

a first position, in which the intensity is low and has a slope of substantially zero as function of the position, a second position, in which the intensity is high and has a slope of substantially zero as function of the position, and a third position, in which the intensity is in between the intensities of the first and second position and has a slope different from zero.

8. The method according to claim 7, wherein the method comprises taking the plurality of samples at least at one of the first, second and third position.

9. The method according to claim 1, wherein the object is a substrate table used in a lithographic apparatus.

10. The method according to claim 1, wherein the method further comprises selecting a data set in time for diagnosing the position measurements of the first and/or second sensor.

11. The method according to claim 1, wherein the method further comprises obtaining Fourier transforms from the position measurements of the first and/or second sensor.

12. The method according to claim 1, wherein said method further comprises performing at least one of said first and second position measurement immediately after moving said object and stopping said moving said object.

13. A system for measuring a position of an object, comprising:

a first sensor to perform a first position measurement while the object is stationary;

a second sensor to perform a second position measurement while the object is stationary, wherein the first and second position measurements differ in type from one another, one of the first and second sensors being configured and arranged to measure a position of an alignment mark positioned either on the object or on a substrate positioned on the object and the other of the first and second sensors being configured and arranged to measure the position of the object at a position other than the position of the alignment mark, both the first and second sensor, respectively, being arranged to take a plurality of samples in time during the first position measurement and the second position measurement, respectively, and the system being arranged to present the first measurement and the second measurement.

14. A computer program, when loaded on a computer arrangement, is arranged to perform the method of claim 1.

15. A data carrier, comprising a computer program according to claim 14.

16. The system according to claim 13, wherein the system is configured to compare the different measurements of the first and the second sensors.

17. The system according to claim 13, wherein the first sensor is one of a device selected from the group consisting of: a transmission image detection, an off-axis alignment sensor, a through-the-lens alignment sensor and an interferometer, and wherein the device of the first sensor is different in type than a device used as the second sensor.

18. The system according to claim 13, wherein the second sensor is one of a device selected from the group consisting of: a transmission image detection, an off-axis alignment sensor, a through-the-lens alignment sensor and an interferometer, and wherein the device of the second sensor is different in type than a device used as the first sensor.

19. The system according to claim 13, wherein the object is a substrate table used in a lithographic apparatus.

* * * * *